United States Patent
Gambin et al.

(10) Patent No.: US 8,710,511 B2
(45) Date of Patent: Apr. 29, 2014

(54) AlN BUFFER N-POLAR GAN HEMT PROFILE

(75) Inventors: Vincent Gambin, Gardena, CA (US); Xing Gu, Redondo Beach, CA (US); Benjamin Heying, Fullerton, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 396 days.

(21) Appl. No.: 13/194,213

(22) Filed: Jul. 29, 2011

(65) Prior Publication Data
US 2013/0026489 A1  Jan. 31, 2013

(51) Int. Cl.
H01L 21/00 (2006.01)

(52) U.S. Cl.
USPC 257/77; 257/194; 257/E21.09; 257/E29.246; 438/478

(58) Field of Classification Search
USPC ................ 257/76, 77, 194, E21.09, E29.246; 438/478
See application file for complete search history.

(56) References Cited

U.S. PATENT DOCUMENTS

| | | | |
|---|---|---|---|
| 5,192,987 A | 3/1993 | Khan | |
| 6,316,793 B1 | 11/2001 | Sheppard | |
| 7,030,428 B2 | 4/2006 | Saxler | |
| 7,052,942 B1 | 5/2006 | Smart | |
| 7,199,408 B2 | 4/2007 | Miyoshi | |
| 7,399,692 B2 | 7/2008 | He | |
| 7,501,670 B2 | 3/2009 | Murphy | |
| 7,544,963 B2 | 6/2009 | Saxler | |
| 7,728,356 B2 | 6/2010 | Suh | |
| 7,884,394 B2 | 2/2011 | Wu | |
| 2005/0006639 A1 | 1/2005 | Dupuis | |
| 2005/0133816 A1 | 6/2005 | Fan | |
| 2006/0226442 A1 | 10/2006 | Zhang | |
| 2007/0205433 A1 | 9/2007 | Parikh | |
| 2008/0124851 A1 | 5/2008 | Zhang | |
| 2008/0176366 A1 | 7/2008 | Mita | |
| 2008/0296618 A1 | 12/2008 | Suh | |
| 2009/0058532 A1 | 3/2009 | Kikkawa | |
| 2009/0065787 A1 | 3/2009 | Kikkawa | |
| 2009/0085065 A1 | 4/2009 | Mishra | |
| 2009/0108299 A1 | 4/2009 | Smorchkova | |
| 2009/0189188 A1 | 7/2009 | Matsushita | |
| 2009/0218599 A1 | 9/2009 | Mishra | |
| 2009/0267078 A1 | 10/2009 | Mishra | |
| 2010/0084687 A1 | 4/2010 | Chen | |
| 2010/0109018 A1 | 5/2010 | Chen | |
| 2010/0201439 A1 | 8/2010 | Wu | |
| 2010/0219452 A1 | 9/2010 | Brierley | |
| 2010/0244041 A1 | 9/2010 | Oishi | |
| 2010/0289067 A1 | 11/2010 | Mishra | |

(Continued)

OTHER PUBLICATIONS

Douglas E. A. "AlGaN/GaN HEMT Degradation under Electrical Stress" Gator Engineering University of Florida.

(Continued)

Primary Examiner — Marvin Payen
(74) Attorney, Agent, or Firm — John A. Miller; Miller IP Group, PLC

(57) ABSTRACT

An N-face GaN HEMT device including a semiconductor substrate, a buffer layer including AlN or AlGaN deposited on the substrate, a barrier layer including AlGaN or AlN deposited on the buffer layer and a GaN channel layer deposited on the barrier layer. The channel layer, the barrier layer and the buffer layer create a two-dimensional electron gas (2-DEG) layer at a transition between the channel layer and the barrier layer.

20 Claims, 2 Drawing Sheets

(56) References Cited

U.S. PATENT DOCUMENTS

| | | | |
|---|---|---|---|
| 2010/0320474 A1 | 12/2010 | Resler | |
| 2010/0320505 A1 | 12/2010 | Okamoto | |
| 2010/0330754 A1 | 12/2010 | Hebert | |
| 2011/0006346 A1 | 1/2011 | Ando | |
| 2011/0042787 A1 | 2/2011 | Sato | |
| 2011/0049526 A1 | 3/2011 | Chu | |
| 2011/0068371 A1 | 3/2011 | Oka | |
| 2011/0272743 A1* | 11/2011 | Hwang et al. | 257/194 |

OTHER PUBLICATIONS

Anderson T. J. "Demonstration of Enhancement Mode AlN/ultrathin AlGaN/GaN HEMTs Using a Selective Wet Etch Approach" CS Mantech Conference, May 17-20, 2010 Portland, Oregon, USA.

Wong Man Hoi, "N-Face Metal-Insulator-Semiconductor High-Electron-Mobility Transistors With AIN Back-Barrier" IEEE Electron Device Letters, vol. 29, No. 10 Oct. 2008, pp. 1101-1104.

Lisesivdin S. B. "Self-consistent scattering analysis of Al0.2Ga0.8N/AlN/GaN/AlN heterostructures grown on 6H-SiC substrates using photo-Hall effect measurements" IOP Publishing 2008, Journal of Physics: Condensed Mater, 20, 045208 pp. 1-6.

Siddharth Rajan, "N-polar GaN/AlGaN/GaN high electron mobility transistors" eScholarship University of California, Aug. 1, 2007 Postprints, Multi-Campus, Journal of Applied Physics 102, 044501, 2007.

Germain Marianne, "High electron mobility in AlGaN/GaN HEMT grown on sapphire: strain modification by means of AIN interlayers" Mat. Res. Soc. Symp. Proc, vol. 798, 2004 Materials Research Society.

Bougrioua Z. "Engineering of an insulating buffer and use of AIN interlayers: two optimisations for AlGaN—GaN HEMT-like structures" Phys. Stat. Sol. (a) 195, No. 1, 93-100, 2003.

Shen L. "AlGaN/AlN/GaN High-Power Microwave HEMT" IEEE Electron Device Letters, vol. 22, No. 10, Oct. 2001.

Parish G. "AlGaN/AlN/GaN High Electron Mobility Transistors with Improved Carrier Transport".

Ambacher, et al. "High Electron Mobility Transistors (HEMTs)".

Shen Likun, "Advanced Polarization-Based Design of AlGaN/GaN HEMTs" a dissertation of Doctor of Philosophy in Electrical and Computer Engineering, Jun. 2004.

Selvaraj, Josephine, "Device Characteristics of Metalorganic Chemical Vapor Deposition-Grown InAlN / GaN High-Electron-Mobility Transistors on AIN / Sapphire Template" Japanese Journal of Applied Physics 48, (2009) pp. 04C102-1 to 04C102-4.

* cited by examiner

AlN BUFFER N-POLAR GAN HEMT PROFILE

GOVERNMENT CONTRACT

The U.S. Government may have a paid-up license in this invention and the right in limited circumstances to require the patent owner to license others on reasonable terms as provided for by the terms of Contract No. HR011-09-C-0132 awarded by DARPA.

BACKGROUND

1. Field of the Invention

This invention relates generally to an N-face GaN semiconductor device and, more particularly, to an N-face GaN high electron mobility transistor (HEMT) device that includes an AlN or AlGaN buffer layer.

2. Discussion of the Related Art

Integrated circuits are typically fabricated by epitaxial fabrication processes that deposit or grow various semiconductor layers on a semiconductor substrate to provide the circuit components of the device. Substrates for integrated circuits include various semiconductor materials, such as silicon, InP, GaAs, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

HEMT devices are popular semiconductor devices that have many applications, especially high frequency or high speed applications. GaN HEMT devices are typically epitaxialy grown on a suitable substrate, such as silicon carbide (SiC), sapphire, silicon, etc., all well known to those skilled in the art. One fabrication process for GaN HEMT devices is referred to in the art as Ga-face fabrication, where the device profile layers are grown having a positive, or Ga polar orientation. For example, a typical HEMT device may have a SiC substrate that includes alternating crystalline layers of silicon and carbon. A nucleation layer, such as an AlN layer, is typically deposited on the SIC substrate to facilitate epitaxial growth, where the nucleation layer is grown on the side of the substrate having a silicon face so that the orientation of the crystalline structure of the nucleation layer, and the subsequent device layers, has a gallium orientation. When the gallium and nitrogen are provided to the vacuum chamber for the epitaxial deposition process of the nucleation layer, the semiconductor elements will be deposited on the substrate based on their crystal orientation so that alternating layers of gallium or aluminum and nitrogen are formed, where a nitrogen layer is formed first. A GaN buffer layer is typically grown on the nucleation layer that provides a crystalline structure having limited defects. An AlGaN barrier layer is deposited on the buffer layer, where the combination of the buffer layer and the barrier layer creates a two-dimensional electron gas (2-DEG) layer for the flow of electrons at the transition between these layers.

Various types of Ga-face fabrication processes have typically been employed because of the efficiency with which the epitaxial layers can be grown. It has been proposed in the art to reverse the orientation of the epitaxial growth process so that the opposite side of the substrate is the side on which the other device profile layers are grown, referred to as N-face or N-polar device processes. A typical N-face GaN HEMT device, sometimes referred to as an inverted-HEMT, typically includes an AlN nucleation layer, GaN buffer layer, an AlGaN back-barrier layer and a GaN channel layer. For the example discussed above for the SiC substrate, the device profile layers are grown on the carbon face of the substrate, so that the crystalline orientation of the device profile layers has a nitrogen orientation instead of a gallium orientation.

As discussed above, for an N-face device, similar layers are basically deposited as for a Ga-face device, but they have an opposite orientation and polarity so that the orientation of the aluminum, gallium and nitrogen crystals that make up the AlGaN/AlN nucleation layer, GaN buffer layer and GaN channel layer are opposite in crystalline orientation. The GaN channel layer is grown on the AlGaN back-barrier layer, where the 2-DEG channel is then formed between those two layers. The channel electrons in the 2-DEG layer are induced from the piezoelectric/spontaneous polarization effect between the AlGaN/AlN back-barrier and the GaN channel layer. For the N-face device, when the AlGaN back-barrier layer is grown on the GaN buffer layer, the opposite orientation of the crystals does not cause the 2-DEG layer to be formed therebetween.

Although N-face fabrication processes are typically more difficult than Ga-face fabrication processes, N-face fabrication processes typically provide more desirable results when forming the 2-DEG layer. Because the channel layer is formed on the AlGaN back-barrier layer in an N-face device, a number of advantages can be realized, such as the ability to make better electrical contact for the source and drain terminals. Also, because the channel layer is between the barrier layer and the contacts, the on/off switching of the device can be performed more quickly and efficiently. Further, the location of the channel layer reduces the buffer leakage current, which saves power and increases performance.

Vertically scaling of an N-face HEMT device can be performed to reduce the gate-to-channel distance, which causes a natural surface depletion to occur that reduces the charge of the 2-DEG layer. This requires a larger polarization charge to provide compensation. The thickness and/or aluminum composition of the AlGaN/AlN back-barrier layer must be increased to maintain sufficient carrier density of the 2-DEG layer. With a standard GaN buffer layer profile, increasing the aluminum composition or back-barrier thickness creates a large stress in the device as a result of differences in the atomic spacing. As a result, the wafer can crack or have severe bowing. This cracking can deplete the charge in the 2-DEG layer. Further, wafer bowing causes a low yield for high resolution lithography.

DETAILED DESCRIPTION OF THE EMBODIMENTS

The following discussion of the embodiments of the invention directed to an N-face GaN HEMT device including an AlN or AlGaN buffer layer is merely exemplary in nature, and is in no way intended to limit the invention or its applications or uses.

Figure 1:
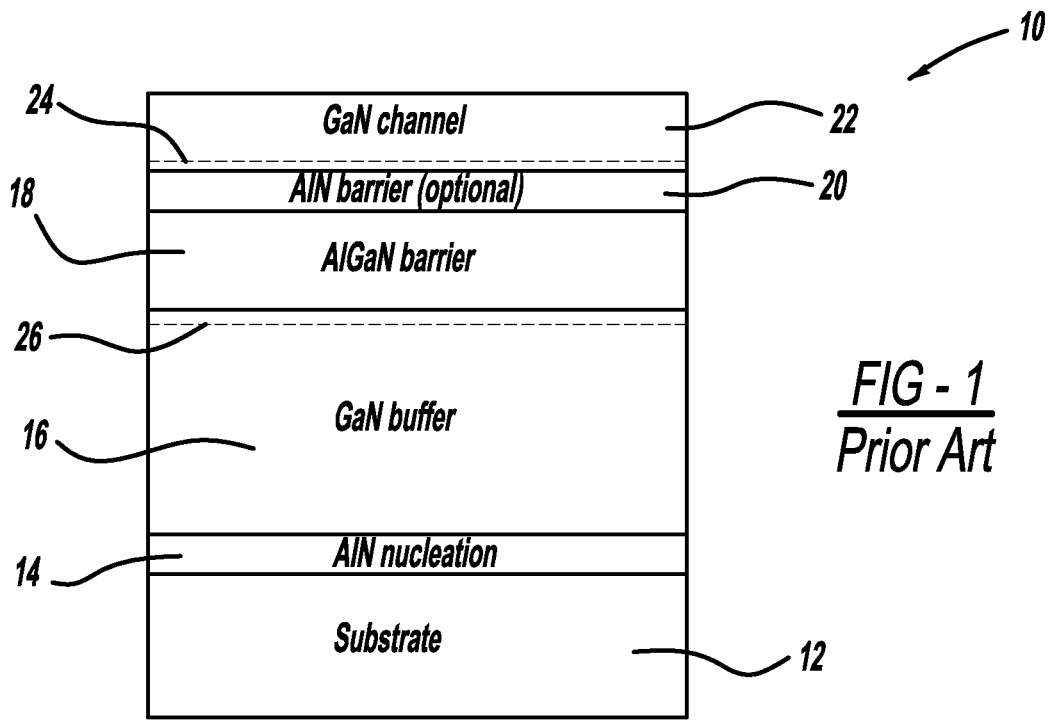
FIG. 1 is a device profile of a known N-face HEMT device.

FIG. 1 is a device profile of a known N-face HEMT device 10 including a substrate 12 on which the various epitaxial or device profile layers of the HEMT device 10 are deposited using known epitaxial growth techniques. The substrate 12 can be any substrate suitable for the purposes discussed herein, such as SiC, sapphire, GaN, AlN, Si, etc. Because the device 10 is an N-face device, the orientation of the substrate 12 is such that the top face of the substrate 12 facing the other profile layers of the device 10 causes the device layers to have a nitrogen orientation, as is well understood by those skilled in the art.

In this embodiment, an AlN nucleation layer 14 is grown on the substrate 12 to provide a base layer for proper epitaxial growth of the device profile layers. Next, a GaN buffer layer 16 is grown on the nucleation layer 14, an AlGaN barrier layer 18 is grown on the buffer layer 16 and an optional AlN barrier layer 20 is grown on the barrier layer 18, where the combination of the layers 18 and 20 form a back-barrier for the electron channel. A GaN channel layer 22 is deposited on the barrier layer 20, where the piezoelectric/spontaneous polarization effect between the AlGaN/AlN back-barrier and the GaN channel layer 22 generates a 2-DEG layer 24 between the barrier layer 20 and the channel layer 22. Suitable patterning and metal deposition steps are then performed to deposit the source, drain and gate terminals (not shown) on the channel layer 22.

In a Ga-face device that may have the same or similar device layers as shown in the device 10, the opposite crystal orientation of the elements and layers that occurs as a result of the epitaxial growth process creates a 2-DEG layer between the buffer layer 16 and the barrier layer 18, where the GaN channel layer 22 would not be included in that type of Ga-face device. The AlGaN barrier layer 18 would be a source of electrons between the contacts and the electron gas within the electron channel.

For the N-face device 10, the orientation of the various elements and layers causes the 2-DEG layer 24 to be on top of the barrier layer 20 allowing it to make better electrical contact with the terminals or contacts (not shown) of the device 10. However, this configuration and orientation of layers creates a free hole charge layer 26 between the layers 16 and 18 as a result of the piezoelectric effect and conservation of charge. The free hole charge layer 26 adversely effects device performance because it creates a parasitic capacitance, can cause leakage currents and reduces the frequency response of the current flow through the device 10. Further, the free hole charge layer 26 causes a flow of holes that creates trap charges, which also limits the speed of the device 10. Also, the transition between the GaN buffer layer 16 and the AlGaN barrier layer 18 creates a lateral tensile strain between the layers 16 and 18 as a result of the difference of the atomic spacing between the lattice orientation of the layers 16 and 18. Particularly, the atomic spacing of the AlGaN and AlN barrier layers 18 and 20 is narrower than the atomic spacing of the layer 16 such that if the concentration of aluminum in the layer 18 or the thickness of the layers 18 and 20 is too high, the lateral tensile strain will cause the layers 18 and 20 to crack or the wafer will have significant curvature. Because this cracking and curvature problem limits the amount of aluminum in the layer 18 and/or the thickness of the layers 18 and 20 that is necessary to prevent the cracking, the amount of charge or electrons available to conduct is also limited, which limits the speed and performance of the device 10.

Figure 2:
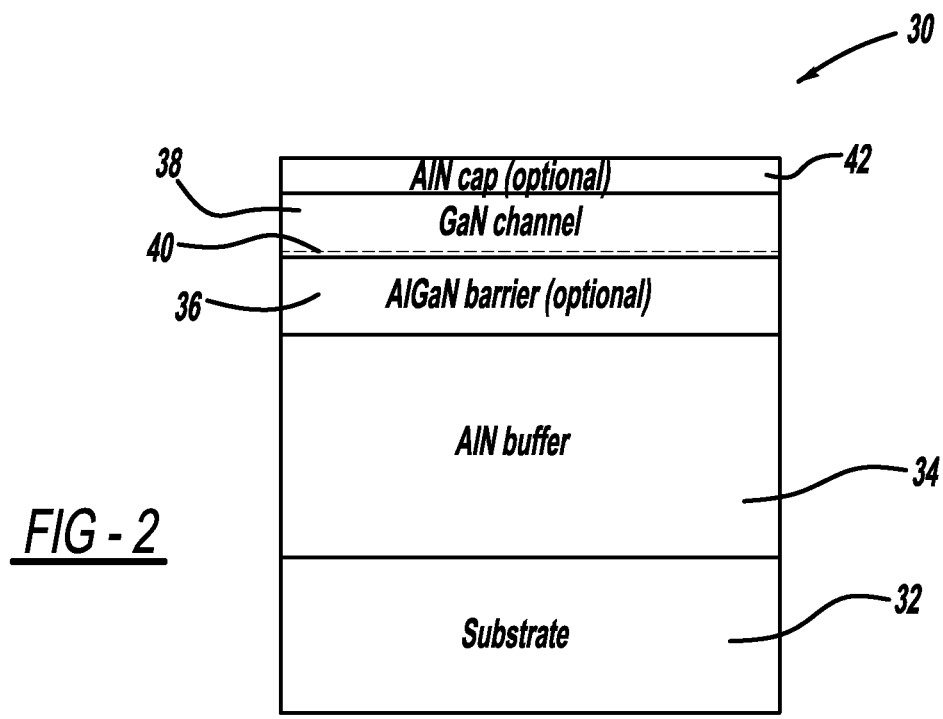
FIG. 2 is a device profile of an N-face HEMT device including an AlN buffer layer.

FIG. 2 is a device profile of an N-face HEMT device 30 that addresses and corrects the problems with the lateral tensile strain in the device 10, as discussed above. The device 30 includes a substrate 32 similar to the substrate 12 and being made of any suitable material. Instead of the AlN nucleation layer 14 and the GaN buffer layer 16, the device 30 includes an AlN buffer layer 34 grown directly on the substrate 32, which eliminates the need for the nucleation layer 14. Therefore, the buffer layer 34 provides both a structure for facilitating epitaxial growth and a layer that reduces defects that may occur in the substrate 32. An optional AlGaN back-barrier layer 36 is grown on the buffer layer 34 and is similar to the barrier layer 18 which can be introduced wherever necessary, or can be eliminated because the AlN buffer layer 34 itself would provide enough charge into the GaN channel. A GaN channel layer 38 is then grown on the back-barrier layer 36, where the piezoelectric/spontaneous polarization effect between the AlN buffer layer 34 and the GaN channel layer 38 causes a 2-DEG layer 40 to form that provides an electron flow channel. In one embodiment, the optional back-barrier layer 36 is graded where the concentration of aluminum and gallium changes as the layer 36 is deposited. Typically, the grading of the optional layer 36 provides a lower concentration of aluminum and a higher concentration of gallium near the transition between the buffer layer 34 and the back-barrier layer 36 and a higher concentration of aluminum and a lower concentration of gallium near the transition between the layer 36 and the channel layer 38. If desired, an optional AlN cap layer 42 can be deposited above the channel layer 38.

Because the gallium is replaced with aluminum in the buffer layer 34, the free hole charge layer will no longer exist. The AlN buffer to substrate interface between the layers 32 and 34 includes a significant number of defects relative to the grown layers, the free hole charge layer is unable to significantly develop, and is not able to carry significant charge. The tensile strain will no longer exist if the AlN buffer layer 34 is used, and when the optional back-barrier layer 36 is used, the strain will be significantly reduced, but in a compressive nature as a result of the addition of aluminum in the buffer layer 34 by reducing the difference in the atomic spacing between the layers 34 and 36. Further, more aluminum in the buffer layer 34 than the back-barrier layer 36 creates a compressive strain that prevents the device 30 from cracking.

There is a strong piezoelectric field between the AlN buffer layer 34 and the GaN channel layer 38 that induces electrons in the 2-DEG layer 40, and thus, the AlGaN back-barrier layer 36 is optional. The wideband gap of the AlN in the buffer layer 34 provides an ideal insulation between the 2-DEG layer 40 and the substrate 32. This eliminates the free hole charge below the back-barrier, which can cause RF performance degradation.

Multiple design options are available to control the electron density of the 2-DEG layer 40, such as controlling the thickness of the GaN channel layer 38, providing the AlN cap layer 42 and/or grading the AlGaN layer 36. Various techniques can be employed to control the number of electrons in the GaN channel layer 38 for a particular device or device application, including selecting the thickness and composition of the back-barrier layer 36. Further, other design considerations can be employed to control the location of the 2-DEG layer 40.

Figure 3:
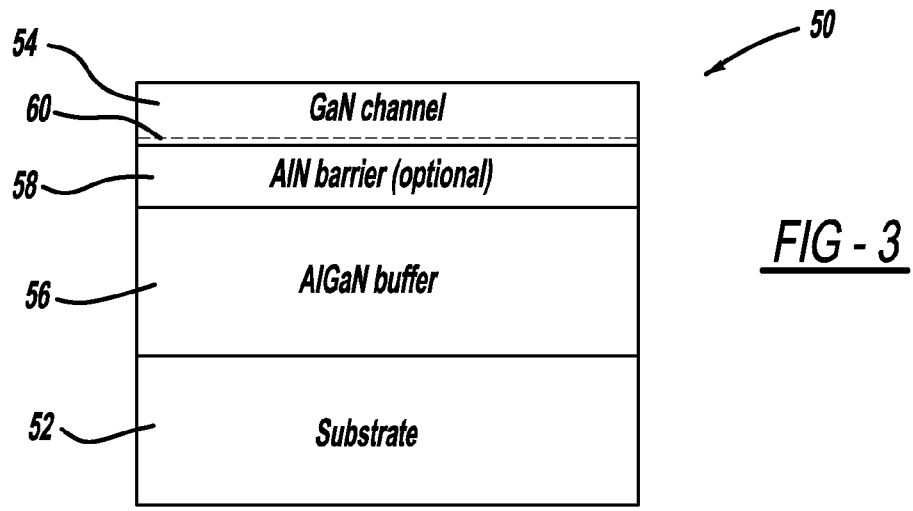
FIG. 3 is a device profile of an N-face HEMT device including an AlGaN buffer layer.

FIG. 3 is a device profile of another N-face HEMT device 50 that also addresses the cracking problems discussed above with the device 10. The device 50 includes a substrate 52 similar to the substrate 32 and a GaN channel layer 54 similar to the channel layer 38. In this embodiment, the AlN buffer layer 34 is replaced with an AlGaN buffer layer 56 that provides the same or similar advantages, for example, reducing or eliminating strain. An optional AlN back-barrier layer 58 is deposited on the buffer layer 56, where the piezoelectric/ spontaneous polarization effect between the back-barrier layer 58 and the channel layer 54 creates a 2-DEG layer 60. The device 50 provides advantages for strain balancing and lattice mismatch while still eliminating the free hole charge layer 28, as discussed above, and the tensile strain between the buffer layer 56 and the back-barrier layer 58. For the device 50, in one non-limiting embodiment, the back-barrier layer 58 may be 2 nm and the channel layer 54 may be 6 nm in thickness.

Figure 4:
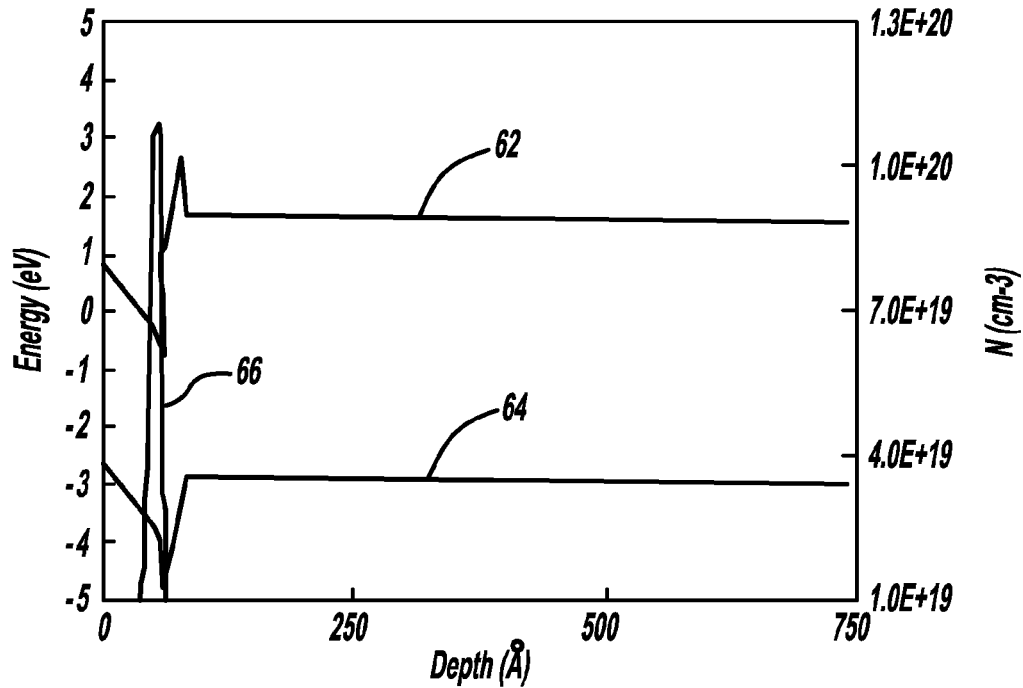
FIG. 4 is a graph with depth on the horizontal axis, energy on the left vertical axis and volume on the right vertical axis showing the electron energy of the device shown in FIG. 3.

FIG. 4 is a graph with depth on the horizontal axis, energy on the left vertical axis and volume on the right vertical axis. Graph lines 62 and 64 identify the energy of the conduction band and the valence band, respectively, in the buffer layer 56, and graph line 66 is the concentration of electrons in the 2-DEG layer 60.

The HEMT devices 30 and 50 offer a number of advantages over the known N-face HEMT profile shown in the device 10. For example, the devices 30 and 50 allow aggressive device scaling due to the strong piezoelectric field between the GaN channel layer and the AlN or AlGaN buffer layer. Further, the large band gap of the AlN or AlGaN buffer layer reduces the buffer leakage and increases channel confinement. Also, epi-layer cracking is eliminated by reducing the tensile strength in the AlGaN back-barrier layer. Also, the devices 30 and 50 eliminate the free hole of charge behind the back-barrier layer and minimize wafer curvature by eliminating tensile stress or balancing overall epi-layer stress. Further, the devices 30 and 50 increase HEMT device performance by enabling increased scaling of channel thickness and 2-DEG charge, reducing access resistance with higher channel charge, providing higher device yield due to reduced wafer bow, providing higher thermal dissipation for the AlN buffer profile with higher thermal conductivity of the AlN layer versus GaN and AlGaN, providing a lower leakage current in the buffer layer and reduce the RF dispersion by hole charge elimination.

The foregoing discussion discloses and describes merely exemplary embodiments. One skilled in the art will readily recognize from such discussion, and from the accompanying drawings and claims, that various changes, modifications and variations can be made therein without departing from the spirit and scope of the disclosure as defined in the following claims.

What is claimed is:

1. An N-face GaN semiconductor device comprising:
   a substrate;
   a buffer layer including aluminum deposited on the substrate;
   a barrier layer including aluminum deposited on the buffer layer; and
   a GaN channel layer deposited on the barrier layer, where the channel layer, the barrier layer and the buffer layer create a two-dimensional electron gas (2-DEG) layer at a transition between the channel layer and the barrier layer.

2. The device according to claim 1 wherein the buffer layer is an AlN buffer layer.

3. The device according to claim 1 wherein the buffer layer is an AlGaN buffer layer.

4. The device according to claim 1 wherein the barrier layer is an AlGaN barrier layer.

5. The device according to claim 4 wherein the AlGaN barrier layer is a graded layer where the aluminum and the gallium in the barrier layer is selectively graded from a higher concentration of aluminum and a lower concentration of gallium at a transition between the buffer layer and the barrier layer to a lower concentration of aluminum and a higher concentration of gallium at a transition between the barrier layer and the channel layer.

6. The device according to claim 1 wherein the barrier layer is an AlN barrier layer.

7. The device according to claim 1 wherein the semiconductor device is a high electron mobility transistor (HEMT) device.

8. The device according to claim 1 wherein the substrate is a silicon carbide (SiC) substrate.

9. An N-face GaN high electron mobility transistor (HEMT) device comprising:
   a silicon carbide (SiC) substrate;
   a buffer layer including aluminum deposited on the substrate;
   a barrier layer including aluminum deposited on the buffer layer; and
   a GaN channel layer deposited on the barrier layer, where the channel layer, the barrier layer and the buffer layer create a two-dimensional electron gas (2-DEG) layer at a transition between the channel layer and the barrier layer.

10. The device according to claim 9 wherein the buffer layer is an AlN buffer layer.

11. The device according to claim 9 wherein the buffer layer is an AlGaN buffer layer.

12. The device according to claim 9 wherein the barrier layer is an AlGaN barrier layer.

13. The device according to claim 12 wherein the AlGaN barrier layer is a graded layer where the aluminum and the gallium in the barrier layer is selectively graded from a higher concentration of aluminum and a lower concentration of gallium at a transition between the buffer layer and the barrier layer to a lower concentration of aluminum and a higher concentration of gallium at a transition between the barrier layer and the channel layer.

14. The device according to claim 9 wherein the barrier layer is an AlN barrier layer.

15. A method for forming an N-face GaN semiconductor device, said method comprising:
   providing a substrate;
   epitaxially growing a buffer layer on a face of the substrate that creates an N-face oriented device where the buffer layer includes aluminum;
   epitaxially growing a barrier layer including aluminum on the buffer layer; and
   epitaxially growing a GaN channel layer on the barrier layer so that the channel layer, the barrier layer and the buffer layer create a two-dimensional electron gas (2-DEG) layer at a transition between the channel layer and the barrier layer.

16. The method according to claim 15 wherein epitaxially growing the buffer layer includes epitaxially growing an AlN buffered layer.

17. The method according to claim 15 wherein epitaxially growing the buffer layer includes epitaxially growing an AlGaN buffer layer.

18. The method according to claim 15 wherein epitaxially growing the barrier layer includes epitaxially growing an AlGaN barrier layer.

19. The method according to claim 15 wherein epitaxially growing the barrier layer includes epitaxially growing an AlN barrier layer.

20. The method according to claim 15 wherein the semiconductor device is a high electron mobility transistor (HEMT) device.

* * * * *